United States Patent [19]

Rahman

[11] Patent Number: 5,580,700
[45] Date of Patent: Dec. 3, 1996

[54] METAL ION REDUCTION IN BOTTOM ANTI-REFLECTIVE COATINGS FOR USE IN SEMICONDUCTOR DEVICE FORMATION

[75] Inventor: M. Dalil Rahman, Warwick, R.I.

[73] Assignee: Hoechst Celanese Corporation, Somerville, N.J.

[21] Appl. No.: 460,611

[22] Filed: Jun. 2, 1995

Related U.S. Application Data

[62] Division of Ser. No. 258,129, Jun. 10, 1994, abandoned, which is a continuation of Ser. No. 982,197, Nov. 25, 1992, abandoned.

[51] Int. Cl.$^6$ ................................................. G03C 1/83
[52] U.S. Cl. .................. 430/311; 430/326; 430/330; 430/510; 430/512; 430/517
[58] Field of Search ...................... 430/311, 326, 430/330, 510, 512, 517

[56] References Cited

U.S. PATENT DOCUMENTS

| | | | |
|---|---|---|---|
| 2,929,808 | 4/1956 | Ross et al. | |
| 4,033,909 | 7/1977 | Papa. | |
| 4,033,910 | 7/1977 | Papa. | |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,747,954 | 5/1988 | Vaughn et al. | 210/670 |
| 4,784,937 | 11/1988 | Tanaka et al. | 430/331 |
| 4,833,067 | 5/1989 | Tanaka et al. | 430/331 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,286,606 | 12/1994 | Rahman et al. | 430/371 |

FOREIGN PATENT DOCUMENTS

| | | |
|---|---|---|
| 544324 | 6/1993 | European Pat. Off. . |
| 544325 | 6/1993 | European Pat. Off. . |
| 1072155 | 3/1989 | Japan . |
| 4-65415 | 3/1992 | Japan . |
| 1509354 | 5/1978 | United Kingdom . |
| 93/12152 | 6/1993 | WIPO . |
| 93/18437 | 9/1993 | WIPO . |
| 94/01807 | 1/1994 | WIPO . |
| 94/12912 | 6/1994 | WIPO . |
| 94/14858 | 7/1994 | WIPO . |
| 94/14863 | 7/1994 | WIPO . |

OTHER PUBLICATIONS

Hirai et al; "Treatment of Waste Waters Containing Formaldehyde and Metals with Chelating Ion Exchange Resins"; Nov. 5, 1975; CA84(14):95328j.

Kimura et al; "Purification of Formaldehyde"; Mar. 9, 1977; CA87(7):52776y.

Journal of the Electromchemical Society, vol. 137, No. 12, Dec. 1990, Manchester, New Hampshire US, pp. 393900–393905, XP0001681, T. Tanada "A New Photolithography Tech. w/Antireflective . . .".

Chemical Abstracts, vol. 112, No. 18, Apr. 30, 1990, Columbus, OH, p. 17, the Abstract 159201u, JP-A-1190713 (Inatomi, Shigeki et al) Jul. 31, 1989.

"Amberlite Ion Exchange Resins Laboratory Guide" by Rohm and Haas Company, Philadelphia, Pa, Sep. 1979.

*Primary Examiner*—Janet C. Baxter
*Assistant Examiner*—Christopher G. Young
*Attorney, Agent, or Firm*—Andrew F. Sayko, Jr.

[57] ABSTRACT

The present invention provides a bottom anti-reflective coating compositions having a very low level of metal ions and a process for producing such compositions utilizing specially treated ion exchange resins. The present invention also provides photoresists produced using such bottom anti-reflective coating compositions and a method for producing semiconductor devices using such photoresists.

10 Claims, No Drawings

METAL ION REDUCTION IN BOTTOM ANTI-REFLECTIVE COATINGS FOR USE IN SEMICONDUCTOR DEVICE FORMATION

This is a divisional of application Ser. No. 08/258,129 filed on Jun. 10, 1994, now abandoned, which is a continuation of Ser. No. 07/982,197 filed on Nov. 25, 1992, now abandoned.

BACKGROUND OF THE INVENTION

The present invention relates to bottom anti-reflective coatings for photoresists and to a process for producing such coatings, which coatings have a very low level of metal ions, especially sodium and iron, and to semiconductor devices produced using such bottom anti-reflective coatings with light-sensitive photoresist compositions and to a process for producing such semiconductor devices. Further, the present invention relates to a process for coating substrates coated with these bottom anti-reflective coating compositions, then coating with a photoresist, as well as the process of coating, imaging and developing light-sensitive photoresist compositions coated with such anti-reflective coatings on such substrates.

Thin film interference plays a central role in the process control of optical microlithography. Small variations in the thickness of resist or of thin films underneath the resist cause large exposure variations, which in turn cause two classes of undesirable line width variations.

1. As thin film thickness varies from run to run, wafer to wafer, or across a wafer, line widths will vary from run to run, wafer to wafer or across a wafer.

2. As patterning takes place over wafer topography, the resist thickness unavoidably changes at the topography edge causing the line width to vary as it crosses the edge.

Avoiding such thin film interference effects is one of the key advantages of advanced processes such as X-Ray lithography or multi-layer resist systems. However, Single Layer Resist (SLR) processes dominate semiconductor manufacturing lines because of the their simplicity and cost-effectiveness, and also because of the relative cleanliness of wet developed processes compared with dry processes.

Thin film interference results in periodic undulations in a plot of the exposure dose required to clear positive photoresist (termed dose-to-clear) versus the photoresist thickness. Optically, on a resist-coated substrate, light reflected from the bottom mirror (due to the effect of the substrate +thin films) interferes with the refection of the top mirror (the resist/air interface).

As optical lithography pushes towards shorter wavelengths, thin film interference effects become increasingly important. More severe swings in intensity are seen as wavelength decreases.

One strategy for reducing thin film interference is to reduce the substrate reflectivity through the use of absorptive anti-reflective coatings. One way of doing this is to apply a bottom anti-reflective coating prior to coating with the photoresist and prior to exposure.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist and the anti-reflective coating from the surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in the photoresist or in a coating on the photoresist, can cause contamination especially during plasma stripping. However, these problems have been overcome to a substantial extent during the fabrication process, for example, by utilizing HCL gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems can be the metal contamination in the anti-reflective coating on the wafer, particularly sodium and iron ions. Metal levels of less than 0.1 ppm can adversely affect the properties of such semiconductor devices.

There are two types of photoresist compositions, negative-working and positive-working. When negative-working photoresist compositions are image-wise exposed to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble in the developer solution (e.g. a rearrangement reaction occurs) while those areas not exposed remain relatively insoluble in the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less then one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to bottom anti-reflective coatings containing very low levels of metal ions, especially sodium and iron and to a process for producing such coatings. The invention further relates to semiconductor devices produced using such bottom anti-reflective coatings for photoresists and to a process for producing such semiconductor devices.

The process of the subject invention provides a bottom anti-reflective coating having a very low level of metal ions. The anti-reflective coating is applied prior to a photoresist, which may be either negative or positive working, although positive photoresists are preferred.

The bottom anti-reflective coatings obtained have very low levels of metal ions such as iron, sodium, potassium, calcium, magnesium, copper and zinc. The total metal ion level is preferably less than 1 ppm, more preferably less than 500 ppb. Sodium and iron are the most common metal ion contaminants and among the easiest to detect. The level of these metal ions serves as an indicator of the level of other metal ions. The level of sodium and iron ions, are each respectively, less than 200 ppb, preferably less than 100 ppb, more preferably less than 50 ppb, even more preferably less than 20 ppb and most preferably less than 10 ppb.

DETAILED DESCRIPTION OF THE PREFERRED EMBODIMENTS

The present invention provides a bottom anti-reflective coating having a very low level of metal ions, particularly sodium and iron and a process for producing such a bottom anti-reflective coating. The process utilizes an acidic ion exchange resin to purify the bottom anti-reflective coating. The subject process comprises:

a) treating an acidic ion exchange resin with water, preferably deionized water, followed by a mineral acid solution (e.g. a 5–98% solution of sulfuric, nitric or hydrochloric acid) to reduce the level of sodium and iron ions in the ion exchange resin to less than 500 ppb each, preferably less than 200 ppb, more preferably less than 100 ppb and most preferably no more than 40 ppb;

b) providing a solution of 2 to 50 weight percent of a dye polymer/reaction product of a copolymer of a methyl vinyl ether and a maleic anhydride and a suitable dye having a molecular weight of from about 500 to about 100,000, such as Disperse Yellow 9, in a suitable solvent;

c) passing the solution through the ion exchange resin and thereby reducing the level of sodium and iron ions in the solution to less than 200 ppb each, preferably less than 100 ppb, more preferably less than 50 ppb, even more preferably less than 20 ppb and most preferably less than 10 ppb;

d) formulating a bottom anti-reflective coating composition by providing an admixture of:
  (1) the ion exchange resin treated dye polymer in a suitable solvent; and
  (2) a suitable solvent. (To adjust the concentration, add more of the same solvent or another suitable solvent.)

Prior to formulating the bottom anti-reflective coating composition, a solution of the copolymer in a suitable solvent and a solution of the dye in suitable solvent are each preferably passed through the ion exchange resin and the level of sodium and iron ions in the respective solution reduced to less than 200 ppb each, preferably less than 100 ppb, more preferably less than 50 ppb, even more preferably less than 20 ppb and most preferably less than 10 ppb.

The suitable solvents are preferably deionized, e.g. deionized cyclopentanone, deionized cyclohexanone, or deionized gamma-butyrolactone (BLO).

Prior to formulating the final bottom anti-reflective coating, an admixture is preferably provided of:
  (1) the ion exchange resin treated copolymer solution;
  (2) the ion exchange resin treated dye solution; and
  (3) a suitable solvent.

The admixture is then reacted and then preferably passed through the ion exchange resin and the level of sodium and iron ions in the solution reduced to less than 200 ppb each, preferably less than 100 ppb, more preferably less than 50 ppb, even more preferably less than 20 ppb and most preferably less than 10 ppb. The concentration of the reaction product in the solvent is adjusted to yield the final formulation by adding a suitable solvent.

Prior to the ion exchange resin treating of the admixture, the individual dye or the copolymer component, the ion exchange resin is treated with a solvent which is the same as or at least compatible with the solvent for the component or mixture of components which is to be treated with the ion exchange resin. Most preferably, the ion exchange resin is treated with sufficient new solvent to substantially remove other solvents and to saturate the ion exchange resin with the new solvent.

An acidic ion exchange resin, such as a styrene/divinylbenzene cation exchange resin, is preferably utilized in the present process. Such ion exchange resins are available from Rohm and Haas Company, e.g. AMBERLYST 15 resin. These resins typically contain as much as 80,000 to 200,000 ppb or more of sodium and iron. Before being utilized in the process of the invention, the ion exchange resin must be treated with water and then a mineral acid solution to substantially reduce the metal ion level. Preferably, the ion exchange resin is initially rinsed with deionized water, followed by a mineral acid solution (such as a 10 percent sulfuric acid solution), rinsed again with deionized water, treated again with the mineral acid solution and once more rinsed with deionized water. Before purifying any component or admixture which has been dissolved in an organic solvent, it is critical that the ion exchange resin is first rinsed with a solvent which is the same as, or at least compatible with, the solvent for the component or admixture to be treated.

The solution of the anti-reflective coating or component is passed through a column containing the ion exchange resin, e.g. a solution of from about 5 to 40 weight percent in a suitable solvent. Such solutions may typically contain from 500 to 20,000 ppb each of sodium and iron ions. During the process of the present invention, these levels are each reduced to as little as 10 ppb, or lower, each.

The present invention also provides a process for producing semiconductor devices using such anti-reflective coatings and semiconductor devices produced using such a process. The subject process comprises:

a) treating an acidic ion exchange resin with water, preferably deionized water, followed by a mineral acid solution (e.g. a 5–98% solution of sulfuric, nitric or hydrochloric acid) to reduce the level of sodium and iron ions in the ion exchange resin to less than 500 ppb each, preferably less than 200 ppb, more preferably less than 100 ppb and most preferably no more than 40 ppb;

b) providing a solution of 2 to 50 weight percent of a dye polymer/reaction product of a copolymer of a methyl vinyl ether and a maleic anhydride and a suitable dye having a molecular weight of from about 500 to about 100,000, such as Disperse Yellow 9, in a suitable solvent;

c) passing the solution through the ion exchange resin and thereby reducing the level of sodium and iron ions in the solution to less than 200 ppb each, preferably less than 100 ppb, more preferably less than 50 ppb, even more preferably less than 20 ppb and most preferably less than 10 ppb;

d) formulating a bottom anti-reflective coating composition by providing an admixture of:
  (1) the ion exchange resin treated dye polymer in a suitable solvent; and
  (2) a suitable solvent. (To adjust the concentration, add more of the same solvent or another suitable solvent.)

Suitable solvents, which are preferably deionized, include BLO, cyclopentanone and cyclohexanone. The solvents may be present in the overall composition in an amount of up to about 95% by weight of the solids in the composition. Solvents, of course, are substantially removed after coating of the bottom anti-reflective coating on a suitable substrate and subsequent drying.

The prepared bottom anti-reflective coating of the present invention can be applied to a substrate by any conventional method used in the photoresist art, including dipping, spraying, whirling and spin coating. When spin coating, for example, the coating solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The bottom anti-reflective coatings produced by the described procedure are particularly suitable for application to thermally grown silicon/silicon dioxide coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing a hexa-alkyl disilazane.

The bottom anti-reflective coating of the present invention is coated onto a suitable substrate, the substrate is then coated with the photoresist composition and the substrate is then treated at a temperature from about 70° C. to about 120° C. for from about 30 seconds to about 180 seconds on a hot plate or for from about 15 minutes to about 90 minutes in a convection oven. This temperature treatment is selected in order to reduce the concentration of residual solvents in the photoresist and anti-reflective coating, while not causing substantial thermal degradation of the photosensitizer.

In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 80° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The substrate is then optionally subjected to a post exposure second baking or heat treatment either before or after development. The heating temperatures may range from about 90° C. to about 120° C., more preferably from about 95° C. to about 120° C. The heating may be conducted for from about 30 seconds to about 2 minutes, more preferably from about 60 seconds to about 90 seconds, on a hot plate or about 30 to about 45 minutes in a convection oven.

The exposed anti-reflective coating/photoresist-coated substrates are then developed to remove the image-wise exposed areas of the photoresist by immersion in a developing solution, such as an aqueous alkaline solution, or developed by a spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Disperse Yellow 9 dye (Aldrich Chemical Company) was dissolved in cyclopentanone and filtered to remove insoluble materials. Grantez AN-169 polymer (copolymer of methyl vinyl ether and maleic anhydride available from Aldrich Chemical Company) was then charged to the cyclopentanone solution with vigorous stirring, and the solution was heated to reflux for approximately 3 hours. The reaction mixture was cooled to room temperature and diluted with deionized cyclopentanone and BLO to yield a bottom anti-reflective coating solution containing 3.8% solids, 89.5% cyclopentanone and 6.7% BLO.

AMBERLYST 15 ion exchange resin beads were placed in a conical flask and deionized water was added so that all of the resin beads were under water. The flask was sealed and allowed to stand overnight to swell the resin beads. The next morning the water was decanted, deionized water was added to again cover the resin beads and the flask was shaken slowly. The water was again decanted. The rinsing with deionized water and decanting steps were repeated three more times. The resulting slurry of ion exchange resin was poured into a glass column equipped with a porous disk and a stopcock. The resin was allowed to settle to the bottom and the column was back flushed with deionized water for 25 minutes. The resin was again allowed to settle to the bottom. The resin bed volume was measured as 60 mL.

A 10 percent sulfuric acid solution (6 bed volumes) was passed down through the resin bed at a rate of about 16 mL per minute (14.1 bed vol. per hour). Deionized water (60 bed vol.) was then allowed to pass down through the resin bed at about the same flow rate. The pH of the effluent water was measured to assure that it matched the pH of about 6 for fresh deionized water. One bed volume of distilled diglyme and one bed volume of deionized cyclopentanone were passed through the column to remove water and saturate the column.

The solution of the bottom anti-reflective coating in cyclopentanone, containing about 700 ppb of sodium and about 1500 ppb of iron, was passed down through the column at about the same flow rate. The cleaned solution obtained had less than 10 ppb sodium, but iron was found to be substantially unchanged at about 1500 ppb.

EXAMPLE 2

The treated bottom antireflective coating of Example 1 was again passed through the resin bed of Example 1, according to the procedure of Example 1. The antireflective coating solution obtained had an even lower level of metal ions as follows: iron—243 ppb, potassium —11 ppb and sodium—less than 10 ppb.

EXAMPLE 3

Disperse Yellow 9 dye was dissolved in cyclohexanone and filtered to remove insoluble materials. Grantez AN-169 polymer was then charged to the cyclohexanone solution with vigorous stirring, and the solution was heated to reflux for approximately 3 hours. The reaction mixture was cooled to room temperature and diluted with cyclohexanone to yield a bottom anti-reflective coating solution containing 7% solids, 93.0% cyclohexanone.

AMBERLYST 15 ion exchange resin beads were placed in a conical flask and deionized water was added so that all of the resin beads were under water. The flask was sealed and allowed to stand overnight to swell the resin beads. The next morning the water was decanted, deionized water was added to again cover the resin beads and the flask was shaken slowly. The water was again decanted. The rinsing with deionized water and decanting steps were repeated three more times. The resulting slurry of ion exchange resin was poured into a glass column equipped with a porous disk and a stopcock. The resin was allowed to settle to the bottom and the column was back flushed with deionized water for 25 minutes. The resin was again allowed to settle to the bottom. The resin bed volume was measured as 60 mL.

A 10 percent sulfuric acid solution (6 bed volumes) was passed down through the resin bed at a rate of about 16 mL per minute (14.1 bed vol. per hour). Deionized water (60 bed vol.) was then allowed to pass down through the resin bed at about the same flow rate. The pH of the effluent water was measured to assure that it matched the pH of about 6 for fresh deionized water. One bed volume of distilled diglyme and one bed volume of deionized cyclohexanone were passed through the column to remove water and saturate the column.

The solution of the bottom anti-reflective coating in cyclohexanone, containing about 1400 ppb of sodium and about 1500 ppb of iron, was passed down through the column at about the same rate. Two samples of treated solution was collected as 57 grams and 105 grams. The treated samples had a very low level of metal ions as follows:

| Metal Ion | Untreated | 57 grams | 105 grams |
| --- | --- | --- | --- |
| Na | 1400 ppb | 480 ppb | <10 ppb |
| Fe | 2000 ppb | 320 ppb | 30 ppb |

I claim:

1. A method for producing a semiconductor device by producing a photoimage on a substrate comprising:
   a) treating an acidic ion exchange resin with water, washing said ion exchange resin with a mineral acid solution and thereby reducing the level of sodium and iron ions in the ion exchange resin to less than 500 ppb each;
   b) providing a solution of 2 to 50 weight percent of a reacted product of a copolymer of a methyl vinyl ether and a maleic anhydride and a suitable disperse yellow 9 dye, in a suitable solvent;
   c) passing said solution through the ion exchange resin and thereby reducing the level of sodium and iron ions in the solution to less than 200 ppb each; and
   d) formulating a bottom anti-reflecting coating composition by providing an admixture of:
      (1) said solution and
      (2) a suitable anti-reflective coating composition solvent;
   e) formulating a photoresist composition solution by providing an admixture of:
      (1) a photosensitive component in an mount sufficient to photosensitize the photoresist composition,
      (2) a water insoluble, aqueous alkali soluble film forming novolak resin in an amount sufficient to form a substantially uniform photoresist composition, and
      (3) a suitable photoresist solvent;
   f) coating a suitable substrate with the bottom anti-reflective composition;
   g) subsequently coating said suitable substrate with the photoresist composition;
   h) heat treating the coated substrate until substantially all of the solvent is removed; image-wise exposing the photoresist composition and removing the image-wise exposed areas of such composition with a suitable developer.

2. The method of claim 1 further comprising heating said coated substrate to a temperature of from about 90° C. to about 120° C. for from about 30 seconds to about 180 seconds on a hot plate or from about 15 minutes to about 40 minutes in an oven after the exposure step but before the removing step.

3. The method of claim 1 further comprising heating said coated substrate to a temperature of from about 90° C. to about 120° C. for about 30 seconds to about 180 seconds on a hot plate or for from about 15 minutes to about 40 minutes in an oven after the removing step.

4. The method of claim 1 wherein said substrate comprises one or more components selected from the group consisting of silicon, aluminum, polymeric resins, silicon dioxide, doped silicon dioxide, silicon nitride, tantalum, copper and polysilicon.

5. The process of claim 1 wherein the amount of novolak resin in the photoresist composition ranges from about 70 percent to about 90 percent, based on the weight of solids.

6. The process of claim 1 wherein the photosensitive component comprises an ester of a multihydroxy phenolic compound.

7. The process of claim 6 wherein the photosensitive component comprises a sulfonic acid derivative of a trishydroxyphenylethane.

8. The process of claim 1 wherein the novolak resin is the reaction product of formaldehyde and one or more multihydroxy phenols.

9. The process of claim 1 wherein any of the solvents are selected from the group consisting of: propylene glycol mono-alkyl ether, propylene glycol methyl ether acetate, ethyl-3-ethoxypropionate, ethyl lactate, mixtures of ethyl-3-ethoxypropionate and ethyl lactate, mixtures of ethyl-3-ethoxypropionate and ethyl lactate, butyl acetate, xylene, diglyme and ethylene glycol monoethyl ether acetate.

10. The method of claim 1 wherein any of the solvents comprise propylene glycol monomethyl ether acetate or ethyl-3-ethoxy propionate.

* * * * *